(12) United States Patent
Butterbaugh et al.

(10) Patent No.: US 11,207,715 B2
(45) Date of Patent: Dec. 28, 2021

(54) SYSTEM AND METHOD FOR MONITORING TREATMENT OF MICROELECTRONIC SUBSTRATES WITH FLUID SPRAYS SUCH AS CRYOGENIC FLUID SPRAYS

(71) Applicant: TEL FSI, INC., Chaska, MN (US)

(72) Inventors: Jeffery W. Butterbaugh, Eden Prairie, MN (US); Christina Ann Rathman, Ellsworth, WI (US); Alan Dee Rose, Wylie, TX (US)

(73) Assignee: TEL MANUFACTURING AND ENGINEERING OF AMERICA, INC., Chaska, MN (US)

( * ) Notice: Subject to any disclaimer, the term of this patent is extended or adjusted under 35 U.S.C. 154(b) by 0 days.

(21) Appl. No.: 16/396,008

(22) Filed: Apr. 26, 2019

(65) Prior Publication Data

US 2019/0337026 A1 Nov. 7, 2019

Related U.S. Application Data

(60) Provisional application No. 62/666,395, filed on May 3, 2018.

(51) Int. Cl.
*B08B 7/04* (2006.01)
*B08B 3/02* (2006.01)
*B08B 3/10* (2006.01)
*G06T 7/00* (2017.01)
*H01L 21/67* (2006.01)

(52) U.S. Cl.
CPC .......... *B08B 7/04* (2013.01); *B08B 3/02* (2013.01); *B08B 3/10* (2013.01); *G06T 7/001* (2013.01); *H01L 21/67028* (2013.01); *H01L 21/67253* (2013.01); *G06T 2207/10016* (2013.01); *G06T 2207/30164* (2013.01)

(58) Field of Classification Search
None
See application file for complete search history.

(56) References Cited

U.S. PATENT DOCUMENTS 4,627,197 A 12/1986 Klee et al.
5,062,898 A 11/1991 McDermott et al.
5,561,527 A * 10/1996 Krone-Schmidt ...... B05B 1/005
356/414

(Continued)

OTHER PUBLICATIONS

PCT International Search Report, International Application No. PCT/US2018/022634, dated May 24, 2018, 4 pages.

*Primary Examiner* — Mikhail Kornakov
*Assistant Examiner* — Pradhuman Parihar
(74) *Attorney, Agent, or Firm* — Kagan Binder, PLLC

(57) ABSTRACT

Techniques herein pertain to apparatus embodiments and methods for treating the surface of a microelectronic substrate, and in particular for removing objects from the microelectronic substrate using fluid treatment sprays such as cryogenic fluid sprays. The apparatus embodiments and methods described herein further include techniques for monitoring and/or controlling treatment processes for removing particles from surfaces of a microelectronic substrate. The techniques allow using image analysis techniques to monitor characteristics of spray nozzle(s) (e.g., frost formation on the nozzle surface) and using the resultant image information of the nozzle to take corrective action if frost or another nozzle condition is detected.

21 Claims, 12 Drawing Sheets

(56) References Cited

U.S. PATENT DOCUMENTS

| | | | | |
|---|---|---|---|---|
| 5,961,732 A | * | 10/1999 | Patrin | H01L 21/02043 134/2 |
| 2002/0190203 A1 | * | 12/2002 | Valaskovic | H01J 49/165 250/288 |
| 2003/0207655 A1 | * | 11/2003 | Jackson | B24C 11/005 451/38 |
| 2006/0174720 A1 | | 8/2006 | Renken et al. | |
| 2018/0269080 A1 | | 9/2018 | Schwab et al. | |

* cited by examiner

Increasing Ar flow rate at 100 SLM, 120 SLM, and 140 SLM at constant LN2 temperature Increasing Ar flow rate at 160 SLM, 170 SLM, and 180SLM at increasing LN2 temperature

SYSTEM AND METHOD FOR MONITORING TREATMENT OF MICROELECTRONIC SUBSTRATES WITH FLUID SPRAYS SUCH AS CRYOGENIC FLUID SPRAYS

PRIORITY

This application claims priority to U.S. Provisional Patent Application No. 62/666,395, filed May 3, 2018, titled "SYSTEM AND METHOD FOR MONITORING TREATMENT OF MICROELECTRONIC SUBSTRATES WITH FLUID SPRAYS SUCH AS CRYOGENIC FLUID SPRAYS," the entire disclosure of which is incorporated herein by reference for all purposes.

FIELD OF INVENTION

This disclosure relates to an apparatus and method for treating the surface of a microelectronic substrate, and in particular for removing objects from the microelectronic substrate using pressurized and cooled fluid material that is sprayed through one or more nozzles at the substrate, wherein a process monitoring system illuminates and captures image information of the nozzle(s) to evaluate frost formation on the nozzle(s).

BACKGROUND OF THE INVENTION

Advances in microelectronic technology have caused integrated circuits (ICs) to be formed on microelectronic substrates (e.g., semiconductor substrates) with ever increasing density of active components. IC manufacturing may be carried out by the application and selective removal of various materials on the microelectronic substrate. One aspect of the manufacturing process may include exposing the surface of the microelectronic substrate to cleaning treatments to remove process residue and/or debris (e.g., particles) from the microelectronic substrate. Various dry and wet cleaning techniques have been developed to clean microelectronic substrates.

However, the advances of microelectronic IC manufacturing have led to smaller device features on the substrate. The smaller device features have made the devices more susceptible to damage and yield loss from smaller particles than in the past. Hence, any techniques that enable the removal of smaller particles, and/or relatively larger particles, without damaging the substrate would be desirable.

SUMMARY OF THE INVENTION

Techniques herein pertain to apparatus embodiments and methods for treating the surface of a microelectronic substrate, and in particular for removing objects from the microelectronic substrate using fluid treatment sprays such as cryogenic fluid sprays. The apparatus embodiments and methods described herein further include techniques for monitoring and/or controlling treatment processes for removing particles from surfaces of a microelectronic substrate. The techniques allow using image analysis techniques to monitor characteristics of spray nozzle(s) (e.g., frost formation on the nozzle surface) and using the resultant image information of the nozzle to take corrective action if frost or another nozzle condition is detected. Such corrective action may include adjusting process parameters in real time in order to help maintain the operating characteristics of the spray. In other instances, a process may be stopped to allow corrective action to be taken. Using imaging techniques to monitor a nozzle can allow rapid, early detection and response to frost formation. In some embodiments, imaging techniques may be used to monitor characteristics of the nozzle(s), the corresponding fluid spray(s), and/or other conditions that correlate to process performance.

In one aspect, the present invention relates to a system for treating a substrate, comprising:
 (a) a process chamber;
 (b) a microelectronic substrate supported within the process chamber;
 (c) a fluid supply system that provides at least one cooled fluid treatment medium through at least one nozzle arranged within the process chamber to dispense a fluid spray into the process chamber; and
 (d) a process monitoring system coupled to the system, said process monitoring system comprising a source that illuminates the at least one nozzle and an image capturing device that captures nozzle image data of the at least one illuminated nozzle, and wherein the process monitoring comprises program instructions to evaluate information comprising the image data to provide an output indicative of whether frost is present on the at least one nozzle.

In another aspect, the present invention relates to a method for treating a substrate, comprising:
 (a) dispensing a fluid treatment medium through a nozzle onto a microelectronic substrate positioned in a process chamber;
 (b) illuminating the nozzle with comprising at least a portion of one or more of visible light, ultraviolet light, and infrared light;
 (c) using an image capture device to capture image data for the illuminated nozzle; and
 (d) using information comprising the captured image data to provide information indicative of whether frost is on the nozzle.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

DETAILED DESCRIPTION OF PRESENTLY PREFERRED EMBODIMENTS

Figure 1:
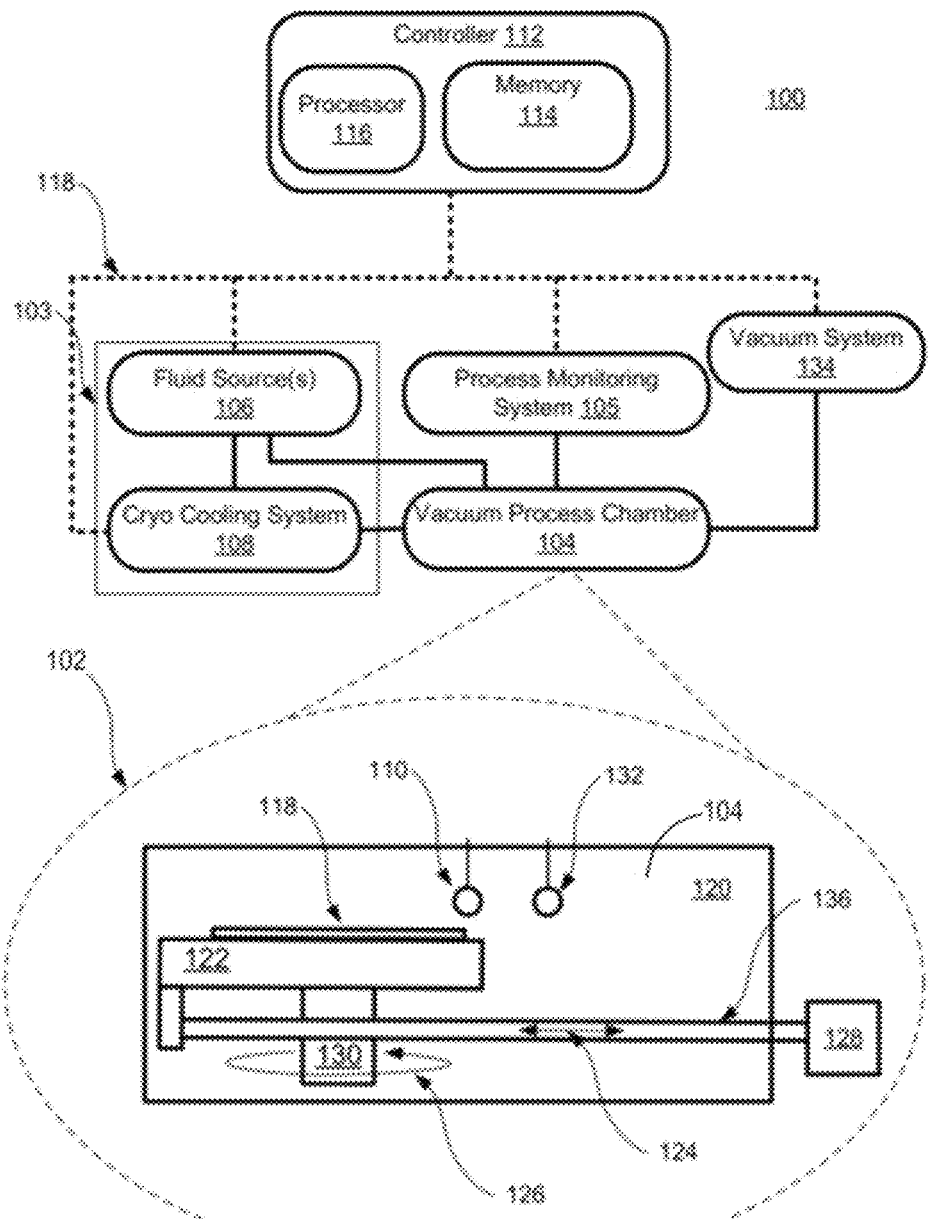
FIG. 1 includes a schematic illustration of a treatment system and a cross-section illustration of a vacuum process chamber of the treatment system according to at least one embodiment.

Methods for selectively removing objects from a microelectronic substrate are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the disclosure. Similarly, for purposes of explanation, specific numbers, materials, and configurations are set forth to provide a thorough understanding of the systems and method. Nevertheless, the systems and methods may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic substrate" as used herein generically refers to the object being processed in accordance with the invention. The microelectronic substrate may include any material portion or structure of a device, particularly a semiconductor or other electronics device, and may, for example, be a base substrate structure, such as a semiconductor substrate or a layer on or overlying a base substrate structure such as a thin film. Thus, the substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation. In addition to microelectronic substrates, the techniques described herein may also be used to clean reticle substrates that may be used to patterning of microelectronic substrates using photolithography techniques.

Cryogenic fluid cleaning is a technique used to dislodge contaminants by imparting sufficient energy from gas, liquid, or solid particles in a fluid spray, e.g., aerosol particles or gas jet particles (e.g., gas clusters), to overcome the adhesive forces between the contaminants and the microelectronic substrate. Hence, producing or expanding cryogenic fluid or fluid mixtures (e.g., aerosols spray and/or gas cluster jet spray) to form a spray comprising particles of the right size and velocity may be desirable. The momentum of the particles or clusters is a function of mass and the velocity. The momentum may be increased by increasing velocity or mass, which may be important to overcome the strong adhesive forces between the particle and the surface of the substrate especially when the particle may be very small (<100 nm). Aerosol embodiments of fluid sprays can include colloidal suspension of particles dispersed in a gas. The particles may include atomic or molecular clusters, solid-phase particles, or liquid-phase droplets.

In order to influence the velocity of a fluid spray, a carrier gas, comprised of atoms/molecules of relatively smaller or larger atomic weight, can be incorporated into the resultant fluid mixture to enhance the cleaning of the contaminants on the substrate. The carrier gas may or may not be cryogenically cooled with the remainder of fluid mixture. The carrier gas will supply a partial pressure in addition to the partial pressure of the primary cryogen fluid or fluid mixture. Use of a carrier gas helps to increase the velocity of the resultant fluid spray. This technique satisfies a growing need in the semiconductor industry to enhance cleaning of substrates with small contaminates that traditional aerosol techniques are limited due to insufficient kinetic energy.

Figure 2:
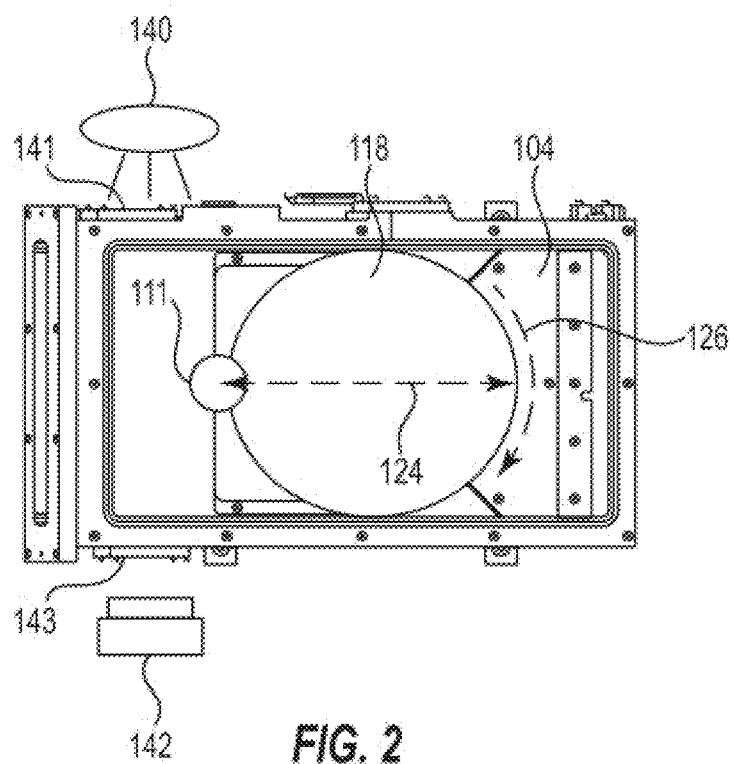
FIG. 2 provides a top view of a treatment system with a process monitoring system according to an embodiment that uses imaging techniques to monitor a fluid spray.
Figure 3:
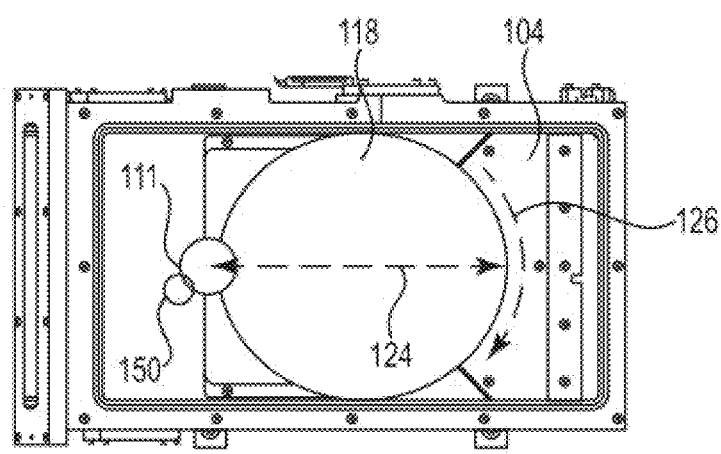
FIG. 3 provides a top view of a treatment system with a process monitoring system according to an embodiment that uses temperature of a fluid spray.
Figure 4:
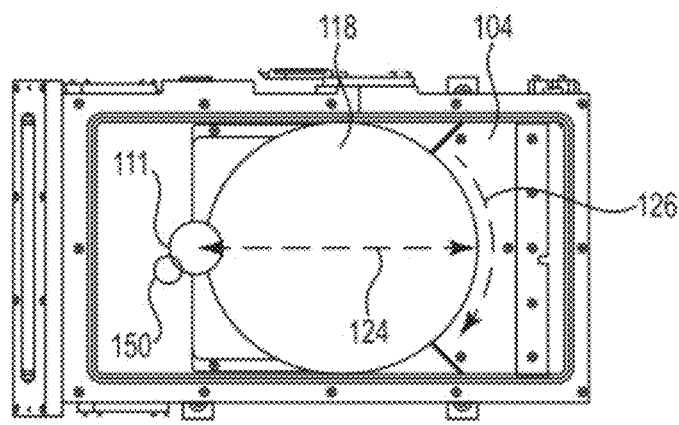
FIG. 4 provides a top view of a treatment system with a process monitoring system according to an embodiment that uses pressure of a fluid spray.

FIGS. 1 and 2 include schematic illustrations of a cleaning system 100 that may be used to clean microelectronic substrates using fluid sprays such as aerosol sprays or gas cluster jet (GCJ) sprays. FIG. 1 includes a cross section illustration 102 of a process chamber 104 where the cleaning takes place. In some modes of practice, the process chamber 104 is maintained under a vacuum. For purposes of illustration, process chamber 104 will be described hereinafter in the illustrative form of a vacuum process chamber 104. The fluid spray 111 (see FIG. 2), such as an aerosol spray or GCJ spray, may be formed from at least one suitable fluid treatment medium supplied to the process chamber 104. The fluid treatment medium may be pressurized and/or cooled and then dispensed into the process chamber 104 such as by expanding the pressurized and cooled fluid or fluid mixtures from a cryogenic fluid supply system 103 into a sub-atmospheric environment in the vacuum process chamber 104. As shown in FIG. 1, fluid source(s) 106 may provide pressurized fluid(s) to a cryogenic cooling system 108 prior to being expanded through a nozzle 110 in the vacuum process chamber 104. A vacuum system 134 may be used to maintain the sub-atmospheric environment in the vacuum process chamber 104, and to remove the fluid spray as needed.

According to various embodiments, one or more of the following variables may be important to removing objects from the microelectronic substrate: pressures and temperatures of the incoming fluid or fluid mixture supplied to the nozzle 110 prior to expansion into the process chamber 104, the flow rate of the fluid or fluid mixture to the nozzle 110, the composition and ratio of components in the fluid mixture if a mixture is used, the pressure in the vacuum process chamber 104, to name a few. Accordingly, a controller 112 may be used to store the process recipes in memory 114 and may use a computer processor 116 to issue instructions over a network 118 that controls various components of the cleaning system 100 to implement the cleaning techniques disclosed herein.

A person of ordinary skill in the art of semiconductor processing may be able to configure the fluid source(s) 106, cryogenic cooling system 108, the vacuum system 134 and their respective sub-components (not shown, e.g., sensors, controls, etc.) to implement the embodiments described herein. For example, in one embodiment, the treatment system 100 includes components that may be configured to provide a fluid treatment medium such as pressurized fluid or fluid mixtures to the nozzle 110 at a pressure between 50 psig and 800 psig. The temperature of the fluid or fluid mixture supplied to the nozzle 110 may be maintained at less than 273 K, such as in the range of 70 K and 270 K, but preferably between 70 K and 150K, by passing the fluid or fluid mixture through a liquid nitrogen ("LN2") dewar of the cryogenic cooling system 108. Hence, adjusting the temperature of the LN2 can be used to adjust the temperature of the supplied fluid or fluid mixture. As described further below, the temperature or the pressure of the incoming fluid or fluid mixture can be adjusted in order to help control the phase of the material supplied to nozzle 110. The vacuum system 134 may be configured to maintain the vacuum process chamber 104 at a pressure that may be less than 35 Torr, or more preferably less than 10 Torr, to enhance the formation of fluid sprays of gas, liquid, or solid particles, e.g., aerosols and/or gas clusters, when the pressurized and cooled material is sprayed into the process chamber 104.

The pressurized and cooled fluid mixture may be expanded into the vacuum process chamber 104 through the nozzle 110 that may direct the fluid spray, e.g., an aerosol spray or GCJ spray, towards the microelectronic substrate 118. At least one nozzle 110 may be supported within the process chamber 104, with the nozzle 110 having at least one nozzle orifice that directs the fluid spray towards the microelectronic substrate 118. For example, in one embodiment, the nozzle 110 may be a nozzle spray bar that has a plurality of openings along the length of the nozzle spray. The nozzle 110 may be adjustable so that the angle of the fluid spray impinging on the microelectronic substrate 118 can be optimized for a particular treatment. The microelectronic substrate 118 may be secured to a substrate stage 122 that provides at least one translational degree of freedom 124, preferably along the longitudinal axis of the vacuum process chamber 120, to facilitate linear scanning at least a portion of microelectronic substrate 128 through the fluid spray emanating from the nozzle 110.

The substrate stage 122 may be coupled to the substrate translational drive system 128 that may include one or more slides and guiding mechanisms to define the path of movement of the substrate stage 122, and an actuating mechanism may be utilized to impart the movement to the substrate stage 122 along its guide path. The actuating mechanism may comprise any electrical, mechanical, electromechanical, hydraulic, or pneumatic device. The actuating mechanism may be designed to provide a range of motion sufficient in length to permit movement of the exposed surface of the microelectronic substrate 118 at least partly through the area of fluid spray emanating from the at least one nozzle 110. The substrate translational drive system 128 may include a support arm (not shown) arranged to extend through a sliding vacuum seal (not shown) in a wall of vacuum process chamber 120, wherein a first distal end is mounted to the substrate stage 122 and a second distal end is engaged with an actuator mechanism located outside the vacuum process chamber 120.

Furthermore, the substrate stage 122 may also include a substrate rotational drive system 130 that may provide at least one rotational degree of freedom 126, preferably about an axis normal to the exposed surface of the microelectronic substrate 118, to facilitate rotational indexing of the microelectronic substrate 118 from a first pre-determined indexed position to a second pre-determined indexed position that exposes another portion of the microelectronic substrate 118 to the fluid spray. In other embodiments, the substrate stage 122 may rotate at a continuous speed without stopping at any indexed position. Additionally, the substrate stage 122 may vary the angle of incidence with the fluid spray by changing the position of the microelectronic substrate 118, in conjunction with varying the angle of the nozzle 110, or just by itself.

In another embodiment, the substrate stage 122 may include a mechanism for securing the microelectronic substrate 118 to an upper surface of the substrate stage 122 during impingement of the at least one fluid spray on the exposed surface of the microelectronic substrate 118. The microelectronic substrate 118 may be affixed to the substrate stage 122 using mechanical fasteners or clamps, vacuum clamping, or electrostatic clamping, for example as might be practiced by a person of ordinary skill in the art of semi-conductor processing.

Furthermore, the substrate stage 122 may include a temperature control mechanism to control a temperature of the microelectronic substrate 118 at a temperature elevated above or depressed below ambient temperature. The temperature control mechanism can include a heating system (not shown) or a cooling system (not shown) that is configured to adjust and/or control the temperature of substrate stage 122 and microelectronic substrate 118. The heating system or cooling system may comprise a re-circulating flow of heat transfer fluid that receives heat from substrate stage 122 and transfers heat to a heat exchanger system (not shown) when cooling, or transfers heat from the heat exchanger system to substrate stage 122 when heating. In other embodiments, heating/cooling elements, such as resistive heating elements, or thermo-electric heaters/coolers can be included in the substrate stage 122.

Figure 5:
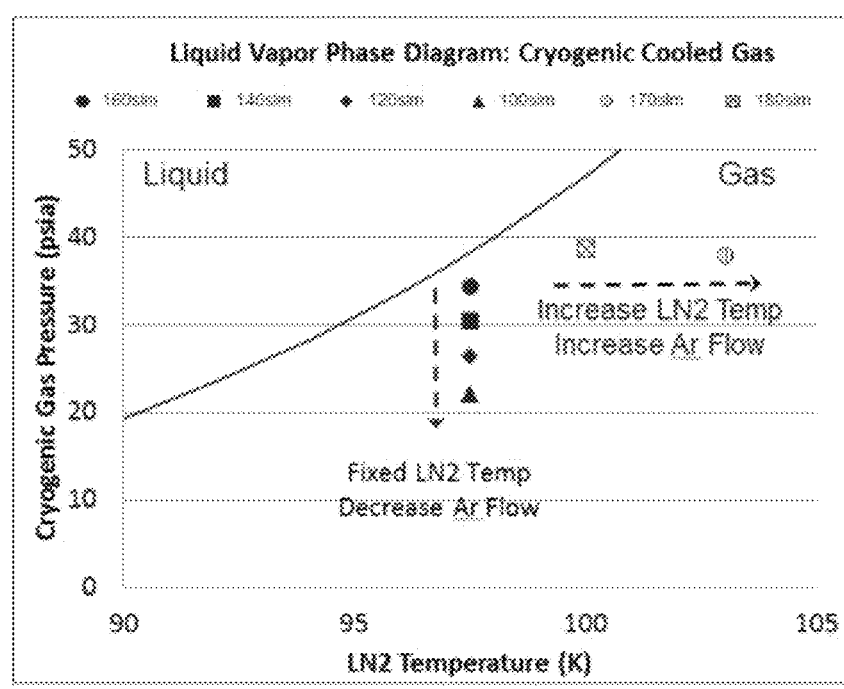
FIG. 5 provides an exemplary liquid-vapor phase diagram for a cryogenically cooled fluid in the form of argon.

As shown best in FIG. 1, the vacuum process chamber 102 may include a dual nozzle configuration (e.g., chamber 102 is configured with both first nozzle 110 and second nozzle 132) that may enable the processing of the substrate 118 using a fluid spray such as a cryogenic aerosol and/or a GCJ spray or a combination thereof within the same vacuum process chamber 120. However, the dual nozzle configuration is not required. Although the nozzles 110,132 are shown to be positioned in a parallel manner they are not required to be parallel to each other to implement the cleaning processes. In other embodiments, the nozzles 110,132 may be at opposite ends of the vacuum process chamber 120 and the substrate stage 122 may move the substrate 118 into a position that enables one or more of the nozzles 110,132 to spray a fluid mixture onto the microelectronic substrate 118.

In another embodiments, the microelectronic substrate 118 may be moved such that the exposed surface area (e.g., area that include the electronic devices) of the microelectronic substrate 118 may be impinged by the fluid spray (e.g., aerosol or GCJ spray) provided from the first nozzle 110 and/or the second nozzle 132 at the same or similar time (e.g., parallel processing) or at different times (e.g., sequential processing). For example, the cleaning process may include an aerosol cleaning process followed by a GCJ cleaning processes or vice versa. Further, the first nozzle 110 and the second nozzle 132 may be positioned so their respective fluid sprays impinge the microelectronic substrate 118 at different locations at the same time. In one instance, the substrate 118 may be rotated to expose the entire microelectronic substrate 118 to the different fluid sprays.

The nozzle 110 may be configured to receive low temperature (e.g., <273K) fluid or fluid mixtures with inlet pressures (e.g., 50 psig-800 psig) substantially higher than the chamber pressures (e.g., <35 Torr). The interior design of the nozzle 110 may enable the expansion of the fluid mixture to generate gas, solid and/or liquid particles that may be directed towards the microelectronic substrate 118. The nozzle 110 dimensions may have a strong impact on the characteristics of the expanded fluid or fluid mixture and range in configuration from simple orifice(s) arranged along a spray bar, multi-expansion volume configurations, to single expansion volume configurations.

The treatment system 100 includes a process monitoring system 105 coupled to the vacuum process chamber 104, and arranged to collect fluid spray data (e.g., aerosol data) for at least one measured attribute of the fluid spray 111 downstream of an exit of the one or more nozzles 110 and 132. The intent is to enhance the performance of the cryogenic aerosol process by directly monitoring the fluid spray 111 to maintain consistent on wafer performance as an alternative to or in combination with other system conditions. Current monitoring of a fluid spray in conventional tools might only measure parameters of fluid material entering a nozzle before spray formation (e.g., gas flow, pressure, and temperature, for example) or process parameters such as process chamber pressure or the like instead of assessing features of the fluid spray 111 itself. As an option, process monitoring system 105 additionally may also monitor other process parameters that do not involve a direct evaluation of the fluid spray 111 itself (e.g., (e.g., supply flow, supply pressure, chamber pressure, supply temperature, and chamber temperature), at least one attribute of the aerosol downstream of the at least one nozzles 110, is measured.

According to an embodiment, the process monitoring system 105 is configured to capture at least one optical image and/or video images of the fluid spray 111, and to use the captured optical information to measure at least one attribute of the fluid spray 111. Examples of fluid spray attributes include spray density is depicted in optical image information, temperature as detected by a temperature sensor 150 in thermal contact with the spray 111, pressure as detected by a pressure sensor 152 in operational engagement with the spray 111, and the like. The optical image can include a shadowgraph or schlieren photograph of the fluid spray. The process monitoring system 105 can be configured to capture a temporal sequence of optical images, and using the temporal sequence of optical images, measure a temporal variation of the at least one attribute of the fluid spray.

For example, the embodiment of system 100 shown in FIGS. 1 and 2 includes a process monitoring system 105 that uses imaging techniques to directly observe and capture images or video of the fluid spray 111 and then to use such image information to assess properties of the fluid spray 111 in real time. The process monitoring system 105 includes a light source 140 arranged to illuminate the fluid spray through chamber window 141, and an optical detector 142 arranged to receive light scattered by the fluid spray 111 during illumination through window 143 and capture one or more optical images of the illuminated fluid spray 111 by observing the fluid spray 111. For example, the process monitoring system 105 is capable of illuminating the fluid spray with white light illumination from light source 140 and then observing the illuminated spray 111 with optical detector 142 by capturing at least one image of the illuminated spray with a digital camera (e.g., a charge-coupled device (CCD) camera, or a charge-injection device (CID) camera). The ability to capture the images and videos of the fluid spray 111 provides a path to monitor and quantify the fluid spray properties and attributes in real time during wafer processing.

FIG. 3 shows an alternative embodiment of system 100 that is identical to system 100 as depicted in FIG. 2 except that process monitoring system 105 comprises a temperature sensor 150 operationally deployed to measure the temperature of fluid spray 111.

FIG. 4 shows an alternative embodiment of system 100 that is identical to system 100 as depicted in FIG. 2 except that process monitoring system 105 comprises a pressure sensor 152 operationally deployed to measure the pressure of fluid spray 111.

FIG. 5 shows how temperature and pressure of the fluid or fluid mixtures supplied to the nozzle 110 of FIGS. 1 to 4 can impact whether the supplied fluid or fluid mixture is in a gas phase, liquid phase, or combination thereof. For purposes of illustration, FIG. 5 shows phase information with respect to pressurized and cooled Argon supplied to nozzle 110. FIG. 5 plots the phase of Argon as a function of argon pressure and liquid nitrogen (LN2) temperature. Because the temperature of the argon cooled by the LN2 correlates to the LN2 temperature, the plot in FIG. 5 shows how the argon phase depends on argon pressure and temperature.

The solid curved line in FIG. 5 is the liquid/gas phase boundary. If a coordinate pair of pressure and temperature is above the line, then the argon is present as a liquid. If a coordinate pair of pressure and temperature is below the line, the argon is present as a gas. If a coordinate pair of pressure and temperature is on the line, then both phases may be present.

FIG. 5 also shows what happens to the argon phase as the argon flow rate is lowered from 160 standard liters per minute (slm) to 100 slm at a constant LN2 temperature.

Generally, the argon pressure tends to decrease as the flow rate is lowered. Hence, FIG. 5 shows what happens as the pressure of supplied argon gas at 160 slm with an LN2 temperature of about 97 K is lowered. As the pressure is lowered at a constant LN2 temperature, the argon state moves downward further away from the phase boundary. Hence, lowering the argon pressure at a constant LN2 temperature provides a way to help ensure that the argon is in a gas phase.

FIG. 5 also shows how to keep the argon in a gas phase if the flow rate, and hence pressure, of the argon is increased to 170 slm, 180 slm, or higher. FIG. 5 shows in the first instance that increasing the flow rate from 160 slm to 170 slm at about 97 K creates a risk that the argon may be partially or wholly present in a liquid phase. If a liquid phase is desired, this indicates that increasing the argon pressure at constant temperature provides a way to shift the supplied argon from a gas phase to a liquid phase. On the other hand, if a higher flow rate of gas phase argon is desired, then FIG. 5 shows that increasing the LN2 temperature helps to shift the higher pressure argon more into the gas phase region, helping to prevent formation of a liquid phase.

Figure 6:
FIG. 6 includes a sequence of fluid spray images to show how changing the flow rate, and hence pressure, of fluid material used to form a fluid spray impacts fluid spray density.
Figure 6:
Figure 7:
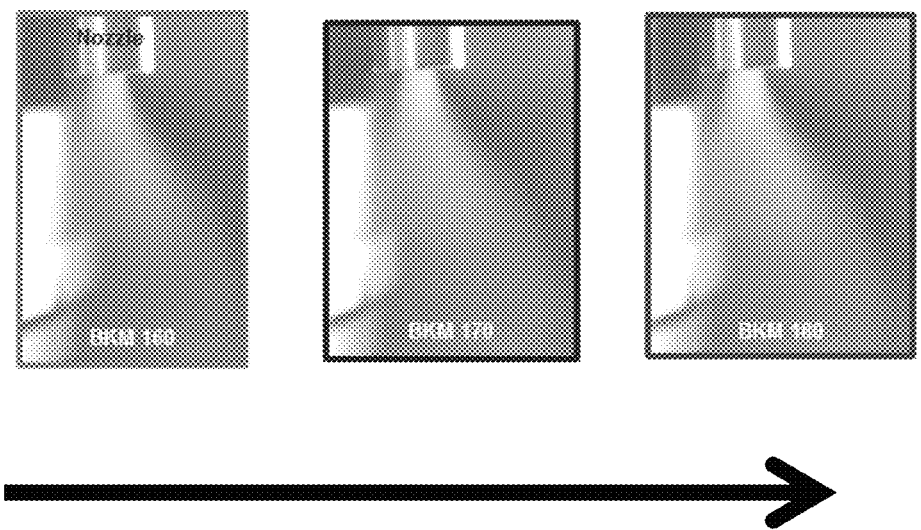
FIG. 7 includes a sequence of fluid spray images to show how changing the temperature of a fluid material to form a fluid spray can maintain fluid spray density at a desired level when the flow rate, and hence pressure, of the fluid material is changed as viewed by the unaided human eye.

FIGS. 6 and 7 show how the temperature and pressure of the incoming fluid material supplied to nozzle 110 impacts the density of the fluid spray 111 dispensed from the nozzle 110. Because the maintaining a fluid spray 111 with a uniform or otherwise controlled density can influence the performance, uniformity, and consistency of treatments, being able to keep the fluid spray density within a desired specification is desired. Collectively, FIGS. 5, 6 and 7 show that pressure and temperature of the supplied fluid material can be adjusted to maintain a desired density, where FIG. 5 shows that adjusting both pressure and temperature may be desired in order to help ensure that the supplied fluid material remains in a desired phase configuration, e.g., liquid, gas, or a combination of liquid and gas.

FIG. 6 shows a sequence of optical images captured of a fluid spray as the flow rate, and hence pressure of argon to the nozzle 110 is decreased from 140 slm to 120 slm and then to 100 slm. The three images of FIG. 6 correspond to the 140, 120, and 100 slm flow rates of argon at constant temperature of 97 K shown in FIG. 5. As the flow rate/pressure decreases at constant LN2 temperature, the density of the fluid spray 111 also visibly decreases as well. Accordingly, monitoring the fluid spray with optical imaging provides a rapid way to detect when the spray density deviates from a desired specification. The pressure of the argon may be increased or decreased in order to increase or decrease the spray density in response to information obtained in optical images of the fluid spray. FIG. 6 further shows how changes in the flow rate cause corresponding changes to the fluid spray that are visible to the unaided human eye.

FIG. 7 shows how temperature adjustments may be made in order to maintain the density of the fluid spray 111 in response to pressure changes of the argon supplied to chamber 110 as viewed by the unaided human eye. The three images of FIG. 7 correspond to the 160, 170 and 180 slm flow rates in FIG. 2. As the flow rate and hence argon pressure increases, the expectation from FIG. 6 would be that the fluid spray density would increase as well, potentially causing the spray 111 to move out of specification. However, by increasing the temperature of the supplied argon (which is accomplished by increasing the LN2 temperature), the density of the fluid spray 111 is maintained. Even though the argon pressure changes significantly in the sequence of images shown in FIG. 7, note how adjusting the temperature of the supplied argon compensates to maintain the spray density in a uniform manner as observed by the unaided human eye.

This shows that temperature of the supplied fluid material can be adjusted in real time in response to image information in feedback control system. In some embodiments, therefore, the process monitoring system 105 includes a controller 112 configured to adjust at least one input parameter to the vacuum process chamber 104, the substrate stage 122, or the cryogenic fluid supply 103 in response to the fluid spray data. The process monitoring system 105 can include a data library for storing aerosol or other fluid spray data. The data library can include different kinds of aerosol or other fluid spray data, including measured aerosol data, simulated aerosol data, empirical aerosol data, extrapolated aerosol data, or interpolated aerosol data, or combinations of two or more thereof. The controller 112 can be configured to adjust at least one input parameter to the vacuum process chamber 104, the substrate stage 122, or the cryogenic fluid supply 106 in response to the aerosol or other fluid spray data. Fluid spray data may be augmented in the sense that two or more kinds of data are used to determine adjustment(s) to parameters that help to control the fluid spray 111.

Figure 8:
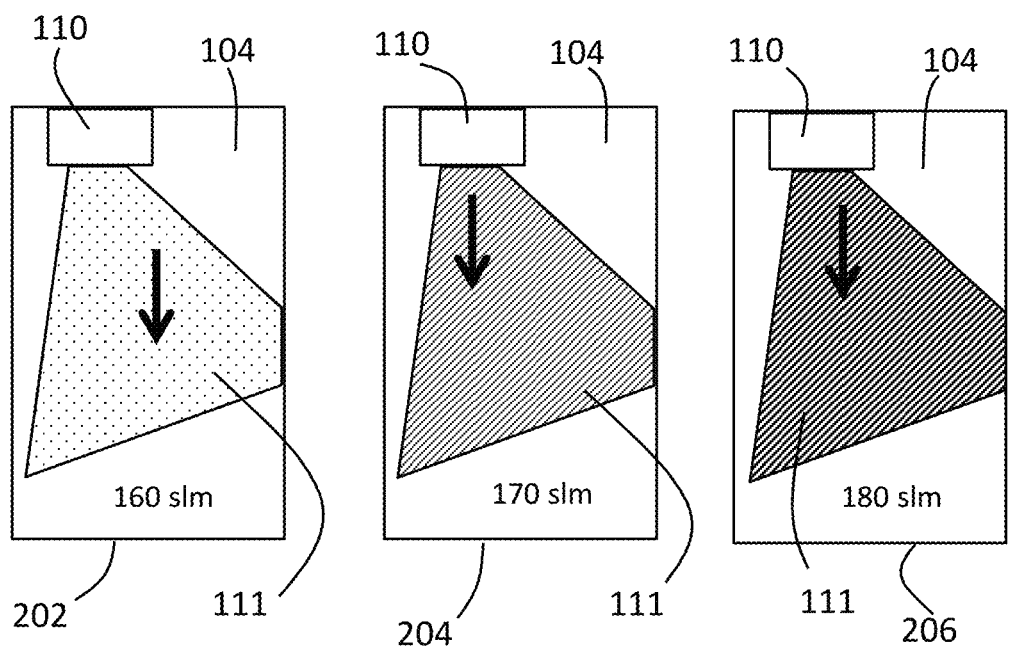
FIG. 8 schematically shows how imaging techniques can be used to show differences among the fluid sprays of FIG. 7 even though such changes were not visible to the unaided human eye.

FIG. 8 schematically shows how differences among the fluid sprays of FIG. 7 can be observed when imaging techniques are applied to the observed fluid sprays 111. In box 202, fluid spray 111 is injected from nozzle 110 into chamber 104 at 160 slm. Although the unaided human eye sees this fluid spray 111 as the same as the fluid sprays 111 in boxes 204 and 206, imaging analysis shows that the fluid spray 111 of box 202 is less dense than the other fluid sprays 111 in boxes 204 and 206. Box 204 shows that the fluid spray 111 sprayed at a higher flow rate of 170 slm is denser than the fluid spray 111 of box 202. Box 206 shows that the fluid spray sprayed at the higher flow rate of 180 slm is even denser than the fluid spray 111 in box 204. FIG. 8 shows that image analysis provide a sensitivity to spray changes that are not as readily observed with the unaided human eye.

Figure 9:
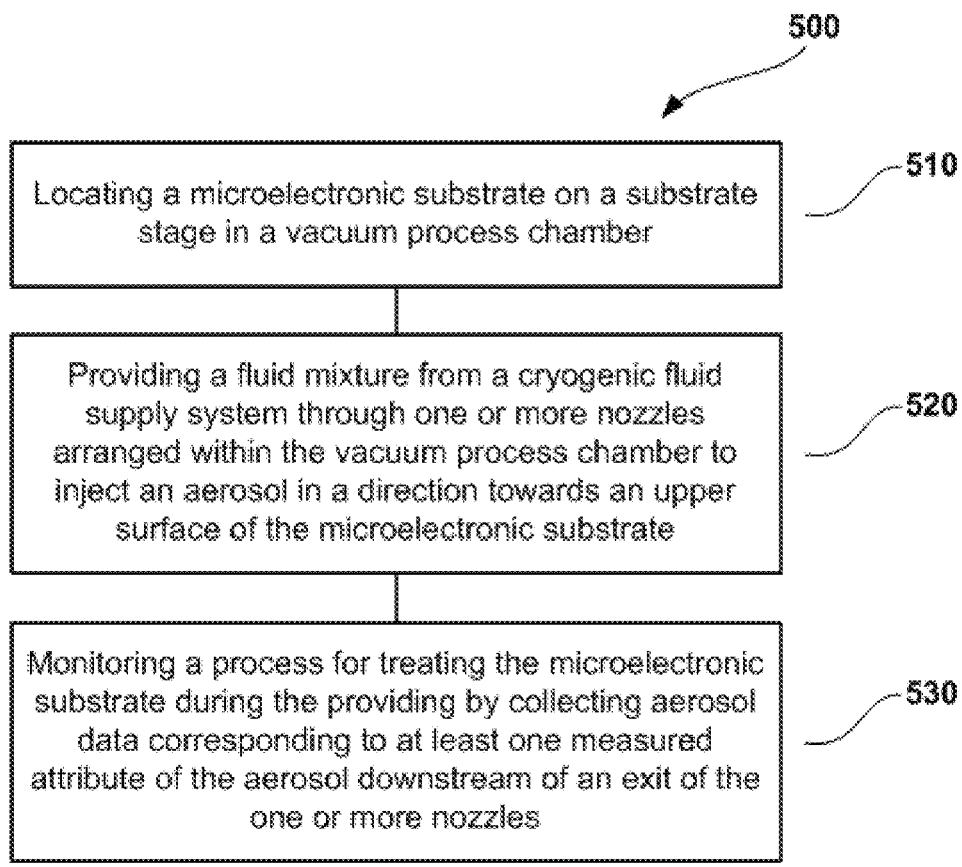
FIG. 9 provides a flow chart illustrating a method of treating a substrate according to an embodiment.

FIG. 9 provides a flow chart illustrating a method 500 of treating a substrate according to an embodiment. The method 500 includes: locating a microelectronic substrate on a substrate stage in a vacuum process chamber in 510; providing a fluid mixture from a cryogenic fluid supply system through one or more nozzles arranged within the vacuum process chamber to inject an aerosol in a direction towards an upper surface of the microelectronic substrate in 520; and monitoring a process for treating the microelectronic substrate during the providing by collecting aerosol data corresponding to at least one measured attribute of the aerosol downstream of an exit of the one or more nozzles in 530. Additionally, the method includes adjusting at least one input parameter to the vacuum process chamber, the substrate stage, or the cryogenic fluid supply in response to the aerosol data.

The modes of practice described with respect to FIGS. 1 through 9 illustrate how principles of the present invention can be used to evaluate spray characteristics as a way to monitor and/or control the performance of a spray process. System 100 shown in FIGS. 1 and 2 also may be used to monitor and/or control the performance and/or progress of a spray process by imaging one or more other features or conditions of the processing environment that could impact process performance such as conditions that may tend to cause undue levels of defects on the substrate 118 being processed. Specifically, it previously has been determined that formation of defect patterns on substrate 118 are highly correlated to the development of frost on the nozzle 110 through which a pressurized and cooled fluid is emitted as a spray 111 into the chamber 104. Accordingly, undue frost formation is desirably avoided during a treatment to avoid defect patterns.

Figure 10:
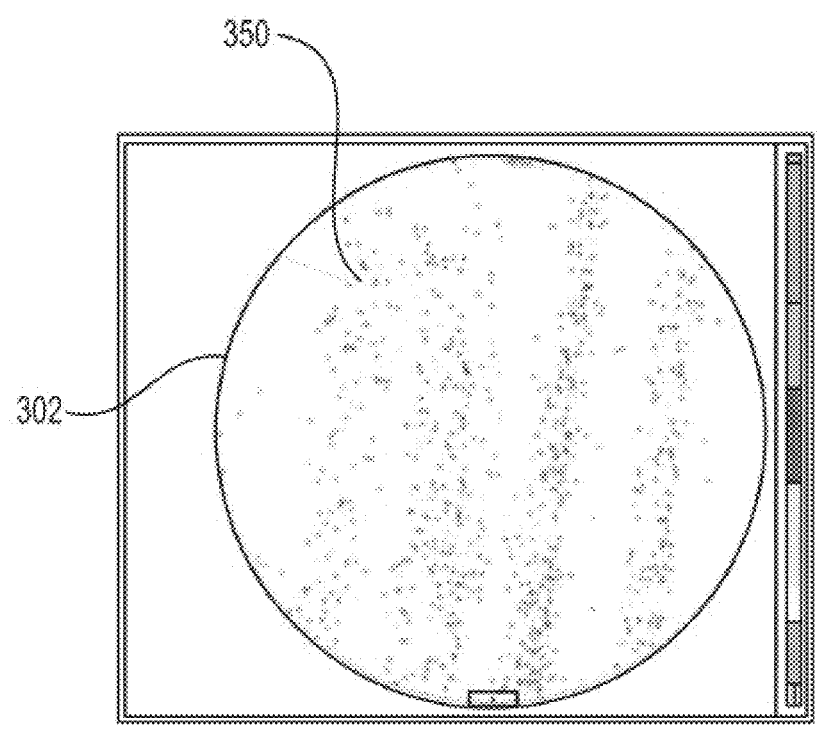
FIG. 10 shows a light scattering defect map of a microelectronic substrate in the form of a 300 mm bare silicon wafer after being processed with a cryogenic spray with a cryogenic spray tool (ANTARES tool available from TEL FSI, Inc., Chaska, Minn.) while frost is visible on the nozzle with the unaided human eye.

One such defect pattern 300 (also referred to as a defect map), which may be described as a vertical streak pattern is shown in FIG. 10 on a 300 mm bare silicon wafer 302 after being processed by an ANTARES brand tool (commercially available from TEL FSI, Inc., Chaska, Minn.) that was purposefully operated while frost was visible to the unaided human eye on the nozzle through which a pressurized and cooled fluid was emitted as a spray to carry out a cleaning treatment. As a consequence of spraying the wafer 302 while the nozzle was frosted, a defect pattern 300 comprising vertical streaks of defects formed on the substrate 302.

A possible theory to explain the correlation between nozzle frost and defects on the substrate can be suggested. Without wishing to be bound by theory, it is believed that the frost results at least in part from atmospheric gases entering the chamber during wafer loading or unloading, or if there is a system leak which condense and possibly freeze on the nozzle surface due to the substantial cooling effect that occurs when pressurized and cooled fluid is sprayed into the lower pressure environment of the process chamber. As the spray is energetically emitted from the nozzle onto the substrate, frost particles are dislodged from the nozzle and carried onto the substrate as well.

Figure 11:
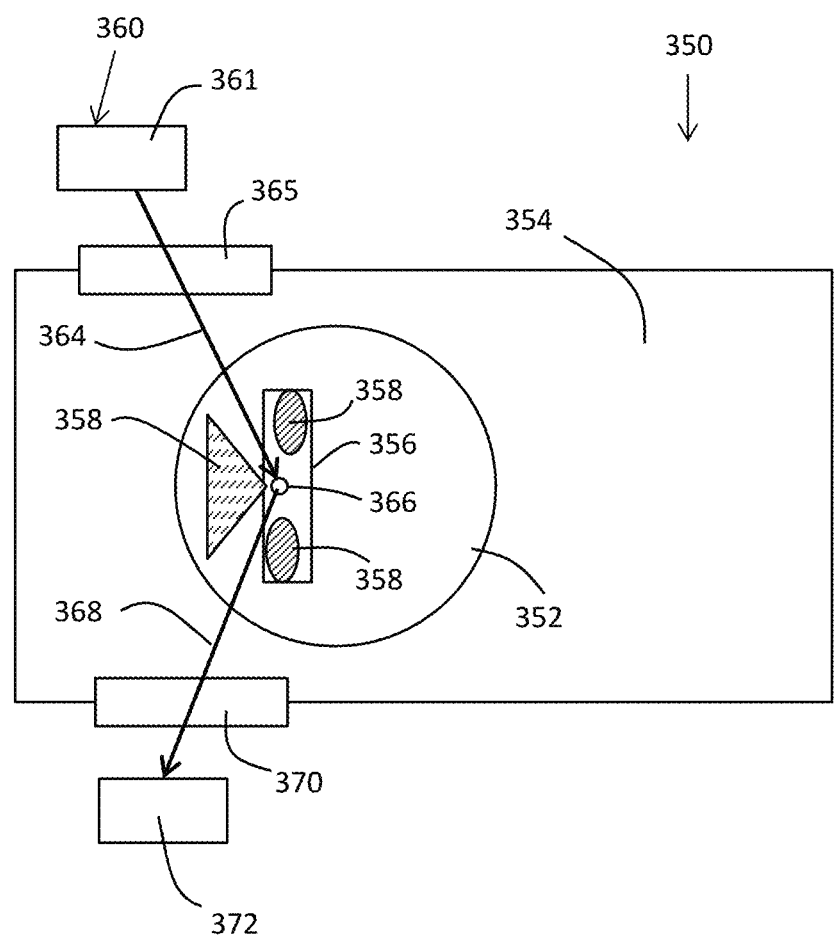
FIG. 11 (prior art) schematically illustrates a cryogenic spray tool that uses a laser in an attempt to detect frost on a spray nozzle of the tool.

The frost problem is a long-standing issue in cryogenic treatment tools, and many attempts have been made to be able to detect frost formation more easily with earlier detection before defect issues become too severe. One conventional technique used laser reflectance as shown schematically in FIG. 11 (prior art). FIG. 11 shows system 350 including a microelectronic workpiece 352 supported in a process chamber 354. Nozzle 356 emits a spray 358 onto workpiece 352. Nozzle 356 is covered with regions of frost 358. A laser beam system 360 is used in an attempt to detect the frost 358 on nozzle 356. Laser beam system 360 includes laser beam source 361 that emits laser beam 364 through window 365 at nozzle 356. Laser beam 364 strikes nozzle 356 at spot 366 and is reflected as reflected beam 368. Reflected beam passes through window 370 and strikes detector 372. The characteristics of the detected reflected beam 368 are then used by a control system (not shown) coupled to the detector in order to evaluate if frost is present on nozzle 356.

A problem with the laser beam approach of FIG. 11 (prior art) is that the laser beam 364 is tightly focused and may not be able to accurately indicate the presence or absence of frost if frost is not on the entire surface of the nozzle. Such a laser technique, due to the constrained beam of the laser, produces a reflected output indicative of only a few square millimeters of the nozzle surface. This provides information for such a small area that it is difficult to avoid signal drift. Also, accurate information about the nozzle surface is not reliable with such a small sample size. The output signal for such an approach also may be unstable and may lack sufficient accuracy to definitively rule out the absence of regions of frost 358. As shown in FIG. 11, spot 366 where the laser beam 364 strikes nozzle 356 happens to be at a location on nozzle 356 where no frost is present, even though regions of frost 358 appear elsewhere. Accordingly, system 360 of FIG. 11 may tend to provide a false indication that no frost is present on nozzle 356.

In contrast, by using imaging analysis to monitor larger areas of the nozzle, the present invention provides a stronger, more reliable, more consistent signal with the ability to make earlier frost detection at a much lower threshold. Advantageously, principles of the present invention allow the presence or absence of nozzle frost to be detected reliably and early enough in the course of a treatment so that corrective action can be taken before a substrate is unduly affected if at all. Examples of corrective action include one or more of stopping the process, launching a corrective or maintenance routine, moving the substrate away from the nozzle until corrective or maintenance actions are completed, altering process conditions to reduce frost formation, combinations of these, and the like.

FIGS. 1, 2, 12a, 12b, and 12c show how principles of the present invention may be practiced in order to monitor nozzle 110 and/or 132 for frost formation. Substrate 118 is provided in chamber 104 of system 102. Nozzle 110 ejects spray 111 onto substrate 118. Chamber 104 is maintained under a vacuum during at least a portion of the time that spray 111 is used to treat substrate 118. A pressurized and cooled fluid (not shown) is used as a source of material to form spray 111. Light source 140 illuminates all or a portion of nozzle 110 (and/or nozzle 132, not shown in FIGS. 12a through 12c) through chamber window 141 with light 145. The light source may emit light 145 in one or more wavelength bands of the electromagnetic spectrum. Exemplary wavelength bands may be selected, for example, from wavelengths including ultraviolet light, visible light, and/or infrared light in wavelengths from $10^{-8}$ m to $10^{-3}$ m in illustrative embodiments. The emitted light may be controlled to be within one or more specific bandwidths of light such as bandwidths of 10 to 200 nm, or 20 to 100 nm, or the like. In one mode of practice, emitting light comprising white light from the visible spectrum would be suitable to illuminate nozzle 110 for frost detection.

As used herein, ultraviolet light refers to light having a wavelength in the range from 100 nm to 400 nm, visible light refers to light having a wavelength in the range from greater than 400 nm to 800 nm, and infrared light refers to light having a wavelength in the range from greater than 800 nm to 1 mm.

In some embodiments as an option, the present invention illuminates nozzle 110 and/or one or more other nozzles (if any) using light that is within one or more selected bandwidth portions of the electromagnetic spectrum. One mode of practice may involve illuminating nozzle 110 and/or one or more other nozzles (if any) with ultraviolet light that is restricted to a selected bandwidth that is in the range from 20 nm to 200 nm wide. For example, the nozzle 110 may be illuminated with filtered ultraviolet light having a wavelength in the range from 150 nm to 200 nm, which corresponds to a bandwidth that is 50 nm wide.

Another mode of practice illuminates nozzle 110 and/or one or more other nozzles (if any) with visible light that is restricted to a selected bandwidth that is in the range from 20 nm to 200 nm wide. For example, the nozzle 110 may be illuminated with filtered visible light having a wavelength in the range from 580 nm to 610 nm, which corresponds to a bandwidth that is 30 nm wide.

In another mode of practice, the present invention illuminates nozzle 110 and/or one or more other nozzles (if any) with infrared light that is restricted to a selected bandwidth that is in the range from 20 nm to 200 nm wide. For example, the nozzle 110 may be illuminated with filtered infrared light having a wavelength in the range from 980 nm to 1080 nm, which corresponds to a bandwidth that is 100 nm wide.

Optical detector 142 in the form of an image capturing device observes nozzle 110 through window 143 and captures image information of the illuminated nozzle 110. A digital camera is an example of a suitable image capturing device. One or more images of all or a portion of the nozzle are captured in the field of view of the image capturing device. It is desirable to capture an image of at least 1 cm$^2$, preferably at least 2 cm$^2$, more preferably at least 4 cm$^2$, and even at least 5 cm$^2$ in order to provide sufficient image information to allow consistent, early detection of frost formation as well as to provide accurate qualitative and quantitative assessments of the amount of frost formation. Capturing image information proximal to nozzle outlet(s) through which material is sprayed is preferred, as such frost material could be at more risk of being dislodged from the nozzle 110 to cause substrate defects.

As an option, the optical detector 142 may be configured to observe one or more selected bandwidth portions of light from the observed nozzle 110. For example, the optical detector may be configured with one or more optical filters, which may be physical filters and/or electronic filters to limit the bandwidth(s) of light captured by the detector 142. Examples of suitable observed bandwidths may be in the range from 10 nm to 200 nm wide.

It is desirable to configure nozzle 110 with a surface finish that provides a suitable level of contrast with frosted surface regions so that imaging techniques can readily identify surface portion(s), if any, that have frost on them. For example, the nozzle 110 may be provided with a glossy and/or or specularly reflective surface, such as is provided by polished stainless steel or polished quartz, in order to accentuate the contrast between the frost-free nozzle surfaces and the frosted nozzle surfaces, if any. As used herein, a glossy or specularly reflective surface is an example of a surface that provides such contrast. Preferred embodiments of a glossy or specularly reflective surface are those in which light is predominantly reflected from the surface in a symmetrical angle with respect to the angle of the corresponding incoming light. In contrast, diffuse or scattered light is reflected in a plurality of different angles in a plurality of directions relative to the angle of the incoming, corresponding light.

For purposes of the present invention, a surface that meets at least one of the gloss criteria or the surface roughness criteria is deemed to be a glossy or specularly reflective surface in the practice of the present invention. According to the gloss criteria, a surface having a 60 degree gloss of greater than 50 GU, preferably greater than 60 GU, more preferably greater than 70 GU according to the most current version of ASTM D523 test method in effect on Apr. 4, 2018, is deemed to be a glossy or specularly reflective surface in the practice of the present invention. According to the surface roughness criteria, A surface that has a a surface roughness (Ra) of less than 50 Ra, more preferably less than 40 Ra, and even more preferably less than 25 Ra according to ASME/ANSI B46.1-1995 is deemed to be a glossy or specularly reflective surface in the practice of the present invention.

This strategy of using contrasting surface effects is effective, because frost has a tendency to reduce the amount of light that is specularly reflected from a surface while, at the same time, increasing the amount of light that is scattered by nonspecular reflection. A glossy or reflective surface tends to have strong specular reflection and relatively weaker scattered reflection, which generally is the opposite of the light reflecting and scattering characteristics of frosted areas. Such contrast between frosted and unfrosted areas also allows imaging techniques to detect very low amounts of frost for earlier detection as well as to allow more consistent, qualitative and quantitative assessment of frost formation.

The nozzle 110 can be observed and imaged by the image capture device with the result that frost formation on nozzle 110 reduces the amount of specularly reflected light from nozzle portions covered with frost. Alternatively, the image capture device could be configured to collect scattered illumination that is not in the direct, reflection line-of-sight, with the result that frost formation increases the amount of scattered light from the nozzle. In other modes of practice, both the reflected light and the scattered light could be observed in order to collect image information to be used for frost evaluation.

Analysis of the digital image data provides information indicative of the presence and/or amount of frost on nozzle 110. One useful technique involves gray scale analysis of the image data. Grayscale analysis involves a range of shades of gray without apparent color. Grayscale analysis often involves evaluating the brightness levels of the three primary colors (red, green and blue) for transmitted light, or brightness levels of the three primary pigments (cyan, magenta and yellow) for reflected light. The darkest possible shade is black, which corresponds to the total absence of transmitted or reflected light of the observed wavelengths. The lightest possible shade is white, which corresponds to the total transmission or reflection of light at all observed wavelengths.

Note that the grayscale value may depend on the observed wavelengths. For example, particular image information within one bandwidth portion of image data obtained by observing a surface may have one grayscale value, while image information within another bandwidth portion of the image data may have a different grayscale value. Grayscale analysis may involve encoding the image information at different levels of resolution such as 8 bit grayscale, 16 bit grayscale, 32 bit grayscale, 64 bit grayscale, or the like.

In the case of transmitted or reflected light, the brightness levels of the three primary colors components each may be represented as a number from decimal 0 to 255, or binary 00000000 to 11111111 in the case of 8-bit grayscale. Other levels of grayscale resolution would use a corresponding number of 0 and 1 digits (e.g., 0000000000000000 to 1111111111111111 for 16-bit grayscale). For every pixel in a grayscale image, R=G=B (or C=M=Y). The lightness of the gray is directly proportional to the number representing the brightness levels of the primary colors. Black is represented by R=G=B=0 or R=G=B=00000000 in an 8-bit system, and white is represented by R=G=B=255 or R=G=B=11111111 in an 8 bit system. Intermediate shades of gray are represented by values between 0 and 255 (or between 00000000 and 11111111 in 8-bit grayscale).

In other words, the pixel grayscale value is a measure of the brightness of a pixel. In current practice, a grayscale value of 0 indicates no light detected in that pixel, while a grayscale value of 255 indicates the highest level of brightness in that pixel. Pixels of a nozzle can be evaluated to see what number, proportion, location, and/or other characteristics of pixels are indicative of frost. The analysis is highly sensitive and able to provide information for both large and small areas of the nozzle, as desired. The location of frost on a nozzle also can be pinpointed.

Figure 12A:
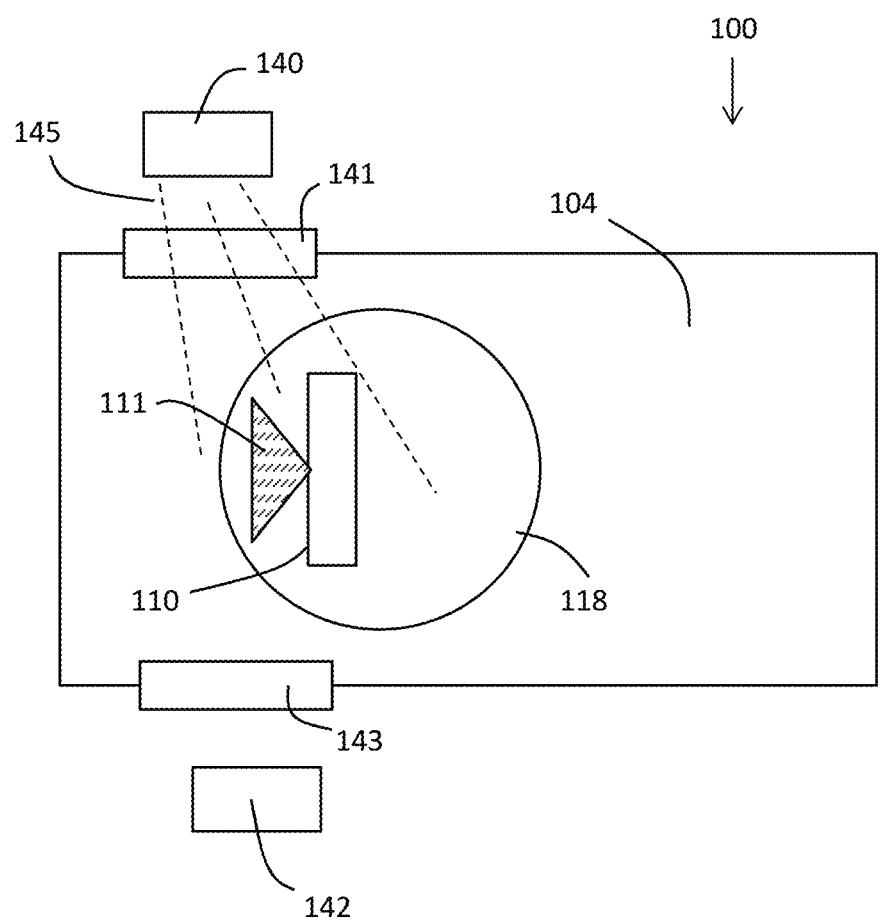
FIG. 12a shows an embodiment of the present invention that uses imaging techniques to monitor a nozzle in the cryogenic spray tool of FIG. 1 while no frost is on the nozzle.
Figure 12B:
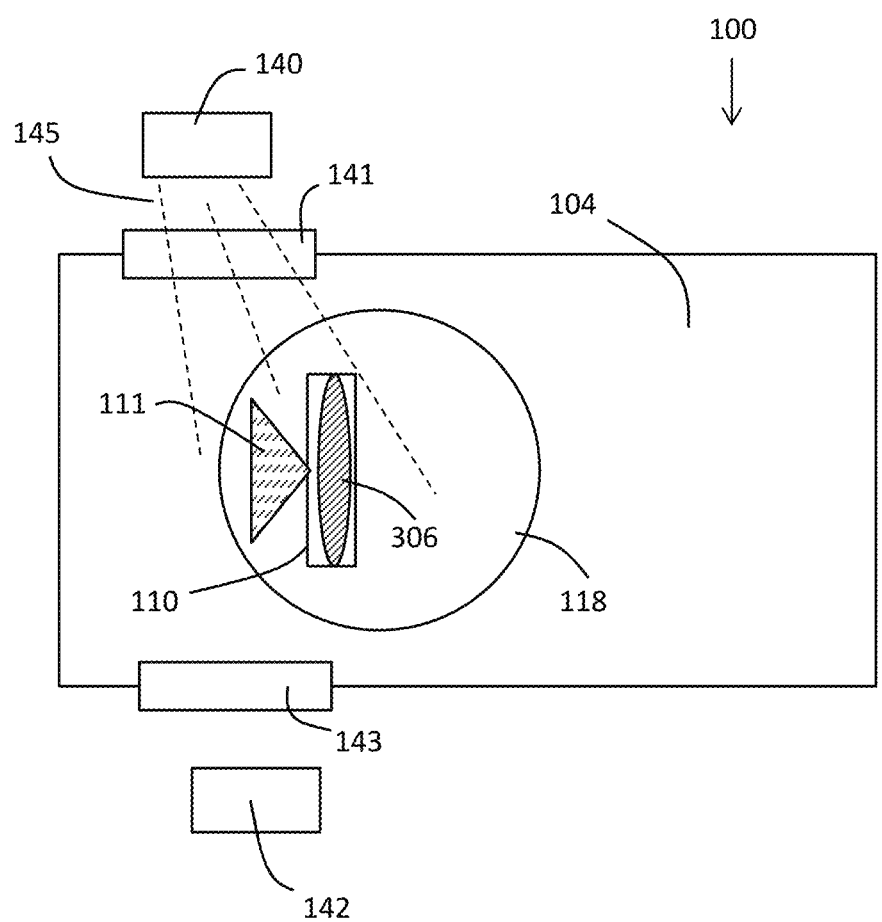
FIG. 12b shows an embodiment of the present invention that uses imaging techniques to monitor a nozzle in the cryogenic spray tool of FIG. 1 while substantial amounts of frost are on the nozzle.
Figure 12C:
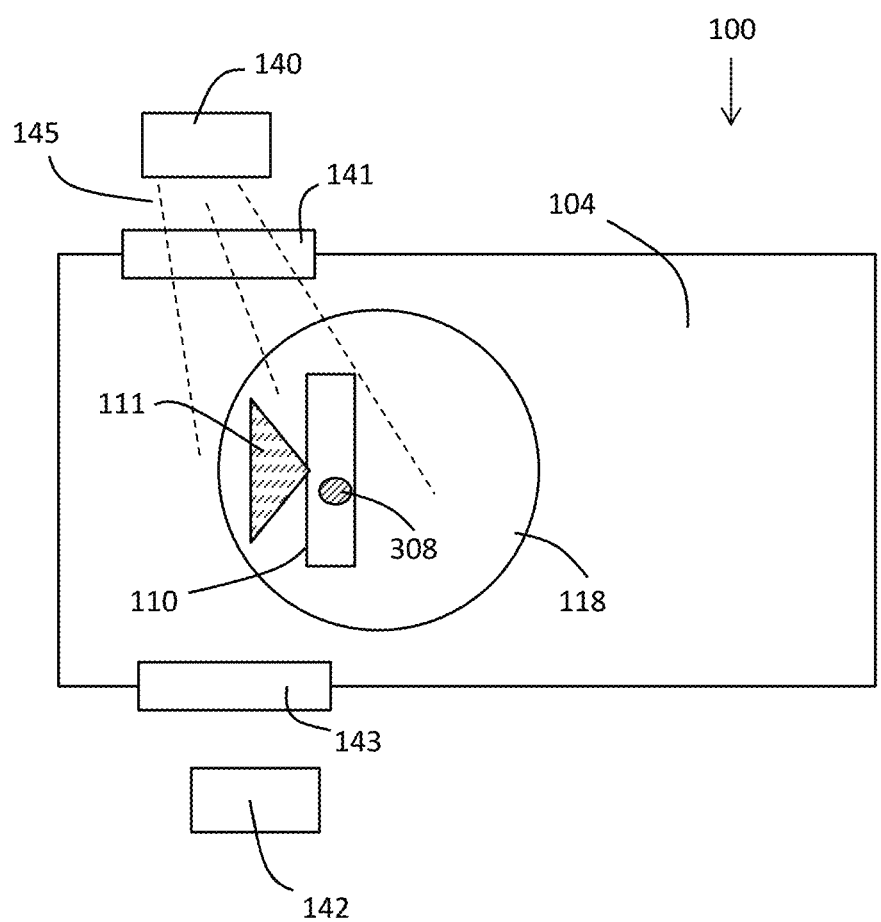
FIG. 12c shows an embodiment of the present invention that uses imaging techniques to monitor a nozzle in the cryogenic spray tool of FIG. 1 while a small amount of frost is detected on the nozzle.

FIGS. 12a, 12b, and 12c schematically show how digital images can be obtained and evaluated by grayscale analysis of reflected light to detect frost on a nozzle. In FIG. 12a, an embodiment of nozzle 110 without any frost is depicted inside of chamber 104. The digital image associated with light reflected from the nozzle 110 is analyzed to count the number of pixels with a grayscale value in the range of 250-255, which can be called "bright" pixels. This 250 cutoff is based on using polished stainless as the reference nozzle surface that is free of frost. A different surface may indicate a different cutoff threshold would be more suitable.

The number of bright pixels on the nozzle having a grayscale value in the range from 250 to 255 are counted. The system is configured so that other pixels in the image information not associated with the nozzle surface are not unduly included in the count. For example, the system is configured to identify pixels associated with the nozzle surface and to analyze those pixels for grayscale brightness. In this context of using polished stainless steel for the nozzle, a bright pixel count of 24,000, for example, may indicate a high number of bright pixels. Such a high level of bright pixel count for reflected light analysis indicates no frost is present.

In FIG. 12b, an embodiment of nozzle 110 covered with frost 306 is shown inside of chamber 104. In the context of using polished stainless steel as the nozzle surface, and using a grayscale cutoff of 250 to 255 for bright pixels, the image information is analyzed to count the number of bright pixels in this range, which would be associated with light reflected from the nozzle. A bright pixel count of 1000, for example, may indicate a lower level of bright pixels having a grayscale value in the range 250 to 255, which is indicative of substantial frost on the nozzle 110.

In FIG. 12c, an embodiment of nozzle 110 covered with a very small amount of frost 308 is shown inside of chamber 104. In the context of using polished stainless steel as the nozzle surface, and using a grayscale cutoff of 250 to 255 for bright pixels, the image information is analyzed to count the number of bright pixels. A pixel count of 10,000 pixels have a grayscale value in the range from 250 to 255, for example, may indicate a moderate amount of frost. The results of FIGS. 12b and 12c highlight the ability of the present invention to detect not only a wide range of frost levels but also low or early frost formation.

FIGS. 12a, 12b, and 12c show that the principles of the present invention are able to confirm the absence of frost or to detect very substantial and very tiny amounts of frost formation on nozzle 110. A threshold value of the bright pixel count can be set as being indicative of frost development to trigger follow up action. Such a threshold may be set at a suitable value that is relative to the bright pixel count with no frost in order to be able to detect frost with high sensitivity. For example, the threshold value may be any bright pixel count less than 100 percent of the bright pixel count with no frost (the base pixel count). To avoid undue amounts of false frost signals at very low levels of frost, the threshold value may be set at values in the range from 70 to 99.9 percent, even 75 to 98 percent, even 80 to 95 percent, or the like with respect to the base pixel count. For example, if a frost-free nozzle is known to have a bright pixel count of 24,000 (i.e., the base pixel count is 24,000) in embodiments evaluating reflected light, then a threshold bright pixel count at some level below 24,000, such as 23,500 pixels, or 22,000 pixels, or 21,500 pixels, or even less may be set as an indicator of frost formation. Generally, a higher threshold bright pixel count generally provides more sensitivity to identify very low frost levels.

In the claims below, any of the dependents limitations can depend from any of the independent claims or other dependent claims.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A system for treating a substrate, comprising
   (a) a process chamber;
   (b) a microelectronic substrate supported within the process chamber;
   (c) at least one nozzle arranged to dispense at least one cooled fluid treatment medium into the process chamber as a fluid spray;
   (d) a fluid supply system that provides the at least one cooled fluid treatment medium to the at least nozzle; and
   (e) a process monitoring system coupled to the system, said process monitoring system comprising a light source that illuminates the at least one nozzle and an image capturing device that captures nozzle image data of a surface of the at least one illuminated nozzle in a manner effective to monitor the surface of the at least one nozzle for frost formation, and wherein the process monitoring system comprises program instructions to evaluate information comprising the nozzle image data of the at least one nozzle surface to provide an output indicative of whether frost is present on the surface of the at least one nozzle.

2. The system of claim 1, wherein the process chamber comprises a first window, and wherein the light source illuminates the at least one nozzle through the first window.

3. The system of claim 1, wherein the light source illuminates the at least one nozzle with light comprising white light.

4. The system of claim 1, wherein the light source illuminates the at least one nozzle with light that is controlled to be within one or more selected wavelength bands, the wavelength having bandwidths in the range from 20 nm to 200 nm wide.

5. The system of claim 4, wherein a selected wavelength band comprises ultraviolet light.

6. The system of claim 4, wherein a selected wavelength band comprises infrared light.

7. The system of claim 4, wherein a selected wavelength band comprises visible light.

8. The system of claim 1, wherein the image data comprises image information for at least 4 cm$^2$ of the at least one nozzle.

9. The system of claim 1, wherein the at least one nozzle comprises a polished surface.

10. The system of claim 9, wherein the at least one nozzle comprises a polished stainless steel surface.

11. The system of claim 1, wherein the program instructions evaluate light that is scattered by the at least one nozzle.

12. The system of claim 1, wherein the program instructions evaluate light that is reflected by the at least one nozzle.

13. The system of claim 1, wherein the process monitoring system is configured to capture a temporal sequence of optical images of the at least one nozzle.

14. The system of claim 1, wherein the process monitoring system further includes a controller configured to adjust at least one process condition for treating the substrate in response to the captured image data.

15. The system of claim 1, wherein the fluid treatment medium is supplied to the at least one nozzle at a temperature greater than or equal to 70 K and less than or equal to 120 K.

16. The system of claim 1, wherein the process chamber is maintained at a chamber pressure of 35 Torr or less during at least a portion of a time period during which the fluid spray is dispensed.

17. The system of claim 16, wherein the chamber pressure is maintained at 10 Torr or less.

18. The system of claim 1, wherein the process chamber is maintained under a vacuum relative to ambient pressure.

19. The system of claim 1, wherein the fluid supply system is a cryogenic fluid supply system that supplies at least one pressurized and cooled fluid treatment medium to the at least one nozzle.

20. The system of claim 1, wherein the fluid spray is dispensed at the microelectronic substrate.

21. The system of claim 1, wherein the at least one nozzle comprises a surface that is specularly reflective when frost-free and that is diffusely reflective when the surface is frosted.

* * * * *